United States Patent
Cheng et al.

(10) Patent No.: US 6,903,573 B1
(45) Date of Patent: Jun. 7, 2005

(54) PROGRAMMABLE LOGIC DEVICE WITH ENHANCED WIDE INPUT PRODUCT TERM CASCADING

(75) Inventors: Jason Cheng, Fremont, CA (US); Cyrus Tsui, Los Altos Hills, CA (US); Satwant Singh, Fremont, CA (US); Albert Chan, Palo Alto, CA (US); Ju Shen, Saratoga, CA (US); Clement Lee, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 34 days.

(21) Appl. No.: 10/619,711

(22) Filed: Jul. 14, 2003

Related U.S. Application Data

(63) Continuation-in-part of application No. 10/133,106, filed on Apr. 26, 2002, now Pat. No. 6,765,408.
(60) Provisional application No. 60/356,507, filed on Feb. 11, 2002.

(51) Int. Cl.[7] ............................................. H03K 19/177
(52) U.S. Cl. ......................................... 326/41; 326/47
(58) Field of Search .............................. 326/37–39, 41, 326/47

(56) References Cited

U.S. PATENT DOCUMENTS

| | | | |
|---|---|---|---|
| 4,758,746 A | * | 7/1988 | Birkner et al. ................. 326/40 |
| 4,769,562 A | | 9/1988 | Ghisio |
| 5,969,539 A | * | 10/1999 | Veytsman et al. ............ 326/39 |
| 5,977,791 A | | 11/1999 | Veenstra |
| 6,020,759 A | | 2/2000 | Heile |
| 6,029,236 A | | 2/2000 | Steele et al. |
| 6,064,599 A | | 5/2000 | Cliff et al. |
| 6,144,573 A | | 11/2000 | Heile |
| 6,150,838 A | | 11/2000 | Wittig et al. |
| 6,208,163 B1 | | 3/2001 | Wittig et al. |
| 6,215,326 B1 | | 4/2001 | Jefferson et al. |
| 6,292,017 B1 | | 9/2001 | Rangasayee |
| 6,396,302 B2 | * | 5/2002 | New et al. .................... 326/38 |
| 2001/0043082 A1 | | 11/2001 | Wittig et al. |

FOREIGN PATENT DOCUMENTS

EP        0866558        9/1998

\* cited by examiner

*Primary Examiner*—James H. Cho
(74) *Attorney, Agent, or Firm*—MacPherson Kwok Chen & Heid LLP; Jon W. Hallman

(57) ABSTRACT

A programmable device with logic blocks is configured to cascade product terms from one logic block to another to increase the logical input width of the product terms. Each logic block may produce a plurality of product terms based upon the selection of inputs from a routing structure. Logic blocks configured to receive cascaded product terms includes a plurality of AND gates corresponding to the plurality of product terms.

13 Claims, 7 Drawing Sheets

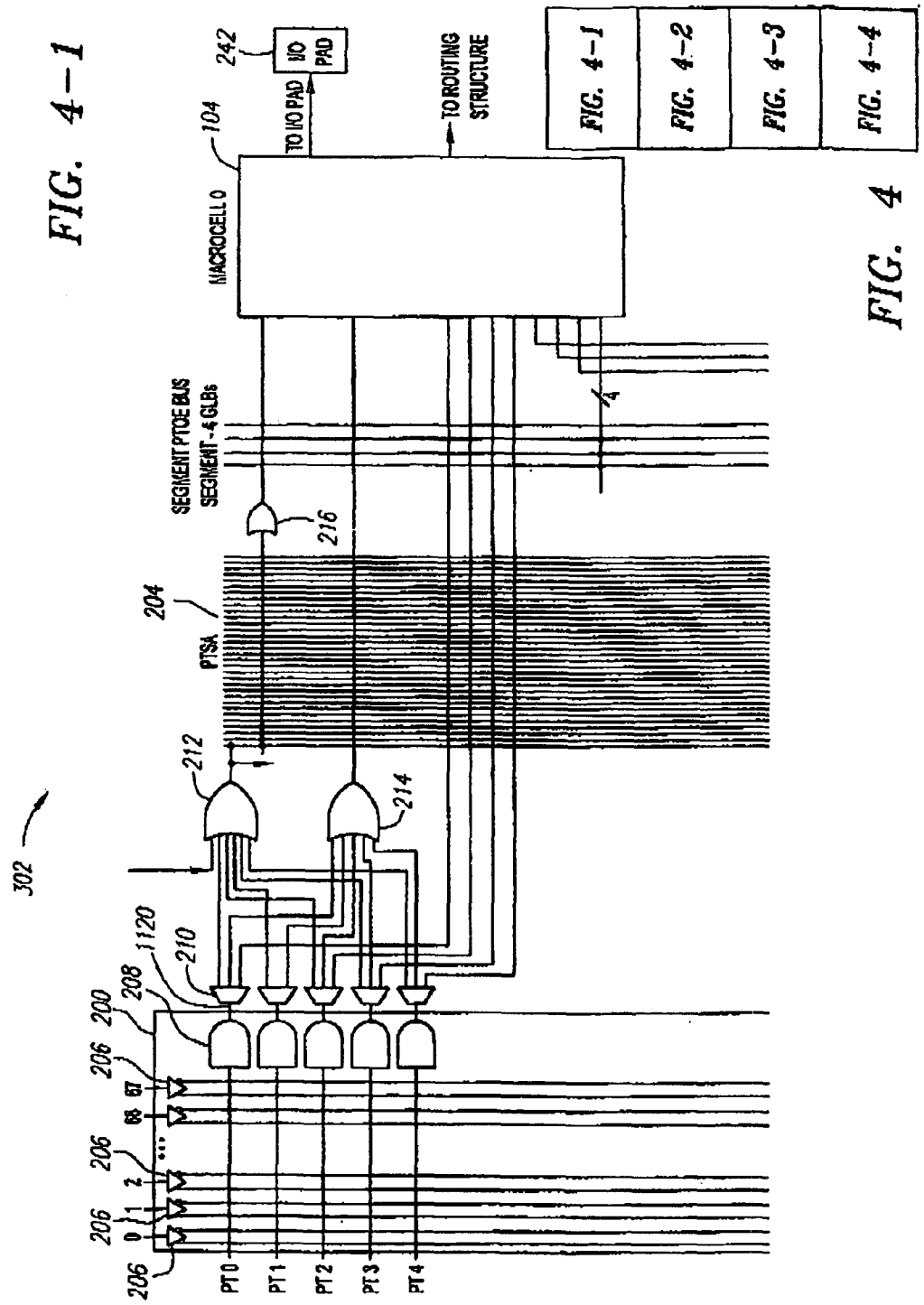

PROGRAMMABLE LOGIC DEVICE WITH ENHANCED WIDE INPUT PRODUCT TERM CASCADING

RELATED APPLICATIONS

This patent application is a continuation-in-part of co-owned U.S. Ser. No. 10/133,106, entitled, "Device and Method With Generic Logic Blocks," filed Apr. 26, 2002, now U.S. Pat. No. 6,765,408, which in turn claims the benefit of U.S. Provisional Patent Application No. 60/356,507, entitled "Device and Method With Generic Logic Blocks," filed on Feb. 11, 2002, the contents of both of which are hereby incorporated by reference in their entirety.

TECHNICAL FIELD

The present invention relates generally to programmable devices. Specifically, the present invention relates to a programmable device providing a product term cascading feature to increase the input width of the cascaded product terms.

BACKGROUND

Programmable logic devices, such as a complex programmable logic device (CPLD), typically include a number of independent logic blocks interconnected by a global or centralized routing structure. For example, FIG. 1 illustrates a block diagram of a conventional CPLD 10 that includes a routing structure 100 and sixteen logic blocks 102, with each logic block 102 having 16 macrocells (not illustrated) and receiving 36 inputs from routing structure 100. The architecture of the logic block and of the routing structure (or interconnect) are two significant factors that determine the density, performance, and scalability of a CPLD.

Each logic block 102 in conventional CPLD 10 includes a programmable AND array (not illustrated) that a user configures to provide product term outputs of the true and complement form of the logical inputs received from routing structure 100. The product terms may be summed and the resulting sum of product terms registered in the macrocells within each logic block 102. The number of logical inputs that may factor into each product term is referred to as the "input width" for a given logic block and is fixed by the routing structure configuration. With respect to FIG. 1, the input width for logic blocks 102 is thirty-six. Another metric for a logic block is its depth, which is determined by the number of product terms that may be summed and registered within each macrocell. Just like the input width, the depth is fixed according to the configuration of a given macrocell.

Users often require relatively wide input logic blocks providing a high density of macrocells to implement complex functions such as decoders. However, as just described, conventional CPLD logic blocks are implemented with a fixed input width such that users may achieve a higher input width only by cascading product terms through the routing structure. This cascading for a portion of CPLD 10 is shown in FIG. 2. Logic block 102a provides logical outputs (either product terms or sum of product terms) having an input width of up to 36 inputs to routing structure 100 to be routed to logic block 102b. At logic block 102b, the cascaded logical outputs are "ANDed" with up to 35 additional logical inputs to provide logical outputs having a maximum input width of 71 logical variables. In turn, the logical outputs from logic block 102b may be cascaded through routing structure 100 and "ANDed" with up to 35 additional logical inputs at logic block 102c to provide logical outputs having a maximum input width of 106 logical variables. Finally, the logical outputs from logic block 102c may be cascaded through routing structure 100 and "ANDed" with up to 35 additional logical inputs at logic block 102d to provide logical outputs having a maximum input width of 141 logical variables.

Although the width cascading discussed with respect to FIG. 2 provides greater flexibility to users, this flexibility is associated with routing structure burdens and routing structure delays. Accordingly, there is a need in the art for logic blocks having enhanced width cascading ability.

SUMMARY

One aspect of the invention relates to a programmable logic device, comprising: a routing structure configured to provide logical inputs; a plurality of logic blocks, each logic block including a programmable AND array operable to provide a plurality of product terms from a plurality of the logical inputs provided by the routing structure, the plurality of product terms being arranged the same for each logic block; wherein a first one of the logic blocks forms a receiver logic block and a second one of the logic blocks forms a feeder logic block, the receiver logic block having an AND gate for each product term, each AND gate being operable to receive its product term and the corresponding product term in the feeder logic block, each corresponding product term being cascaded from the feeder logic block over a dedicated lead.

Another aspect of the invention relates to a programmable logic device, comprising: a plurality of logic blocks each operable to provide a plurality of product terms selected from a plurality of logical inputs provided by a routing structure, wherein the plurality of product terms is arranged the same for each logic block and wherein the size of the plurality of logical inputs is the same for each logic block; and means for cascading product terms, wherein the means is configured to form the product of the product terms from a first one of the logic blocks with the corresponding product terms selected from one or more of the remaining logic blocks, and wherein for each logic block selected, the maximum-achievable input width for the product is increased by the plurality of logical inputs.

BRIEF DESCRIPTION OF THE DRAWINGS

Use of the same reference symbols in different figures indicates similar or identical items.

DETAILED DESCRIPTION

The input-width cascading feature disclosed herein will be described with respect to an exemplary complex programmable logic device (CPLD) architecture. However, it will be appreciated that the input-width cascading feature described is widely applicable to any suitable programmable logic device (PLD) architecture. The present invention provides a programmable logic device including a plurality of programmable logic blocks. Each programmable logic block includes a plurality of product term circuits that form a programmable AND array. The product term output from each product term circuit is the product (the logical AND function) of one or more logical inputs selected from a set of possible logical inputs. The selection of the logical inputs used to form a product term output depends upon the desired logical function a user wants to implement. Based upon the desired logical function, fuse points within each product term circuit are activated to "fuse in" the required logical inputs. Each fuse point includes a memory cell such as an SRAM memory cell or an EEPROM memory cell. Configuration signals control the activation of the fuse points as is known in the art.

Figure 1:
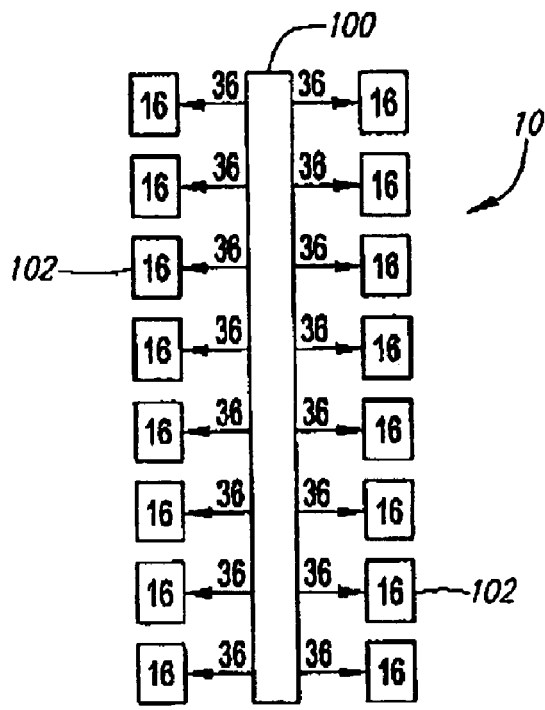
FIG. 1 is a block diagram of a conventional complex programmable logic device (CPLD).
Figure 2:
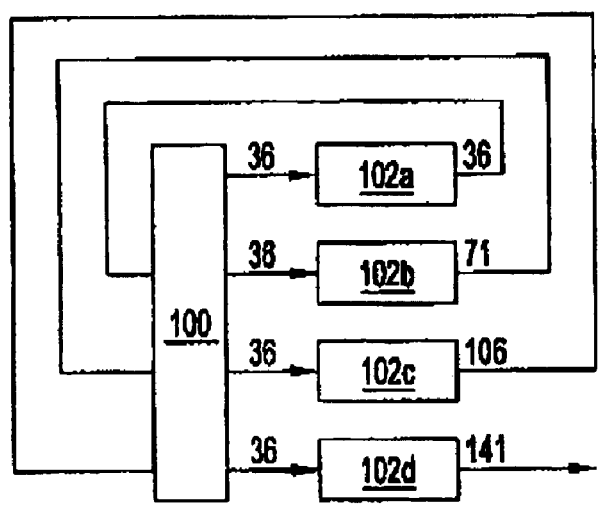
FIG. 2 illustrates a conventional input width cascading using the routing structure in the CPLD of FIG. 1.
Figure 3:
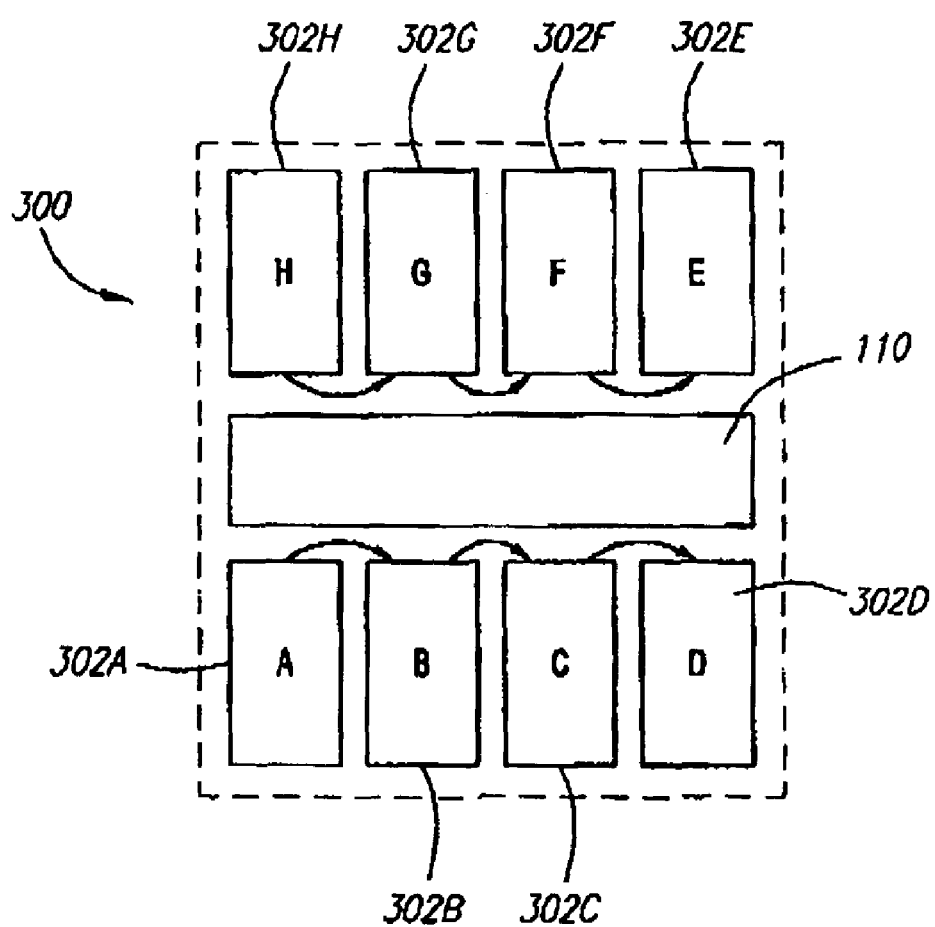
FIG. 3 illustrates a programmable device with a plurality of logic blocks according to one embodiment of the invention.

FIG. 3 illustrates one embodiment of a programmable device 300 with a plurality of programmable logic blocks 302A–302H. Each programmable logic block 302A–302H comprises a plurality of product term circuits as will be described further herein. The programmable device 300 may be implemented on a single microchip. There are eight programmable logic blocks 302A–302H in FIG. 3, but other embodiments of the programmable device 300 may have any suitable number of programmable logic blocks, such as 16, 32, 64, 1000 or 10,000 programmable logic blocks. Also, the programmable logic blocks 302A–302H may be arranged in a number of different configurations.

The programmable logic blocks 302A–302H receive and transmit signals, such as data and control signals, via a routing structure 110. Depending upon the number of logic blocks being implemented, routing structure 110 may be segmented or un-segmented. In a segmented structure, logic blocks would be grouped into segments, where each segment is connected with a first portion (which may be denoted as the first level) of routing structure 110. Segments would then be connected with a second level of routing structure 110. The device 300 may also have an isolated, non-volatile memory block (not illustrated), such as EEPROM, that transfers configuration signals and instructions to the programmable logic blocks 302A–302H upon power-up if the fuse points comprise volatile memory such as SRAM cells.

Figures 2, 4:
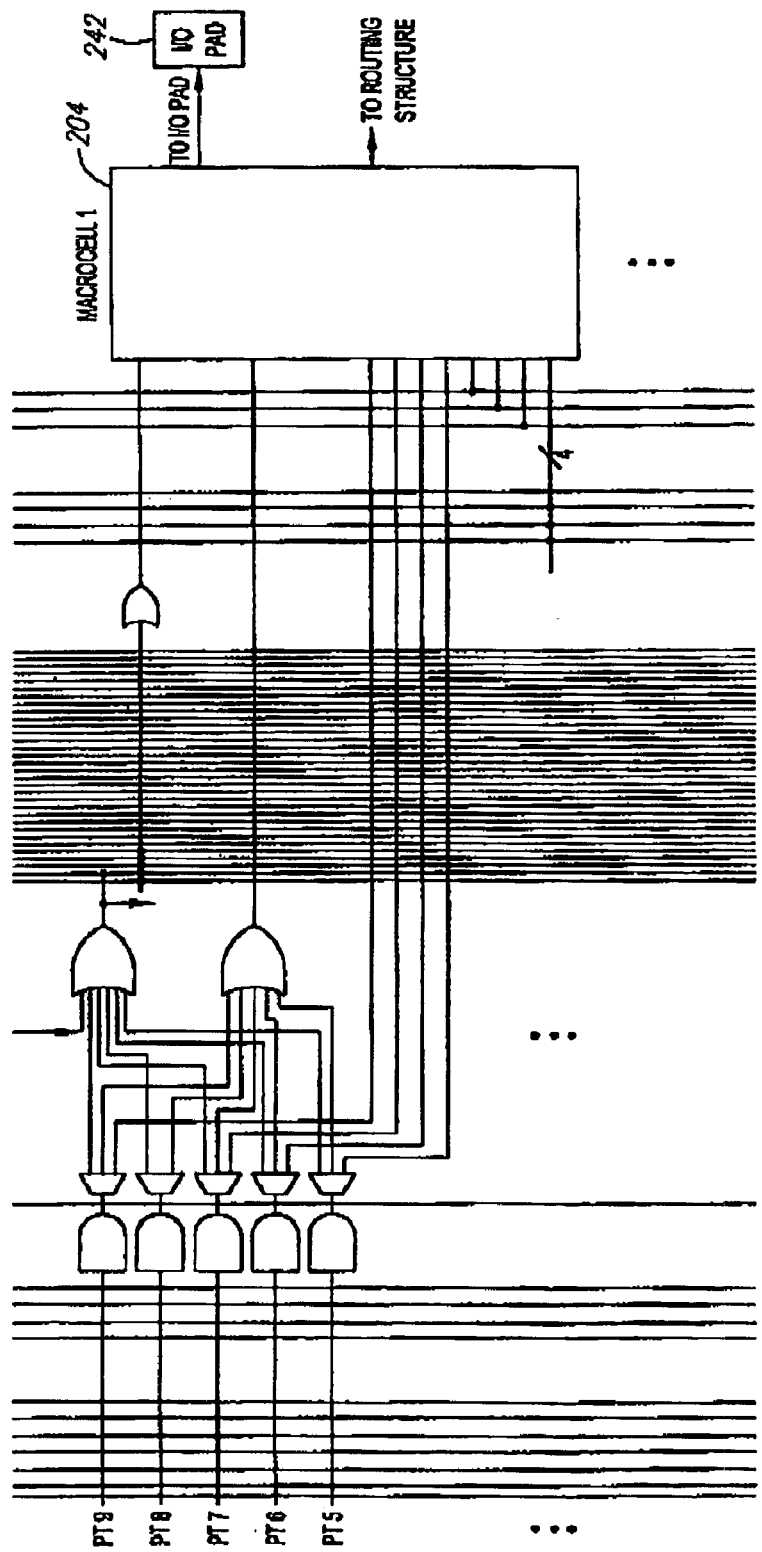
FIG. 4 is a block diagram for a programmable logic block of FIG. 3.
Figures 3, 4:
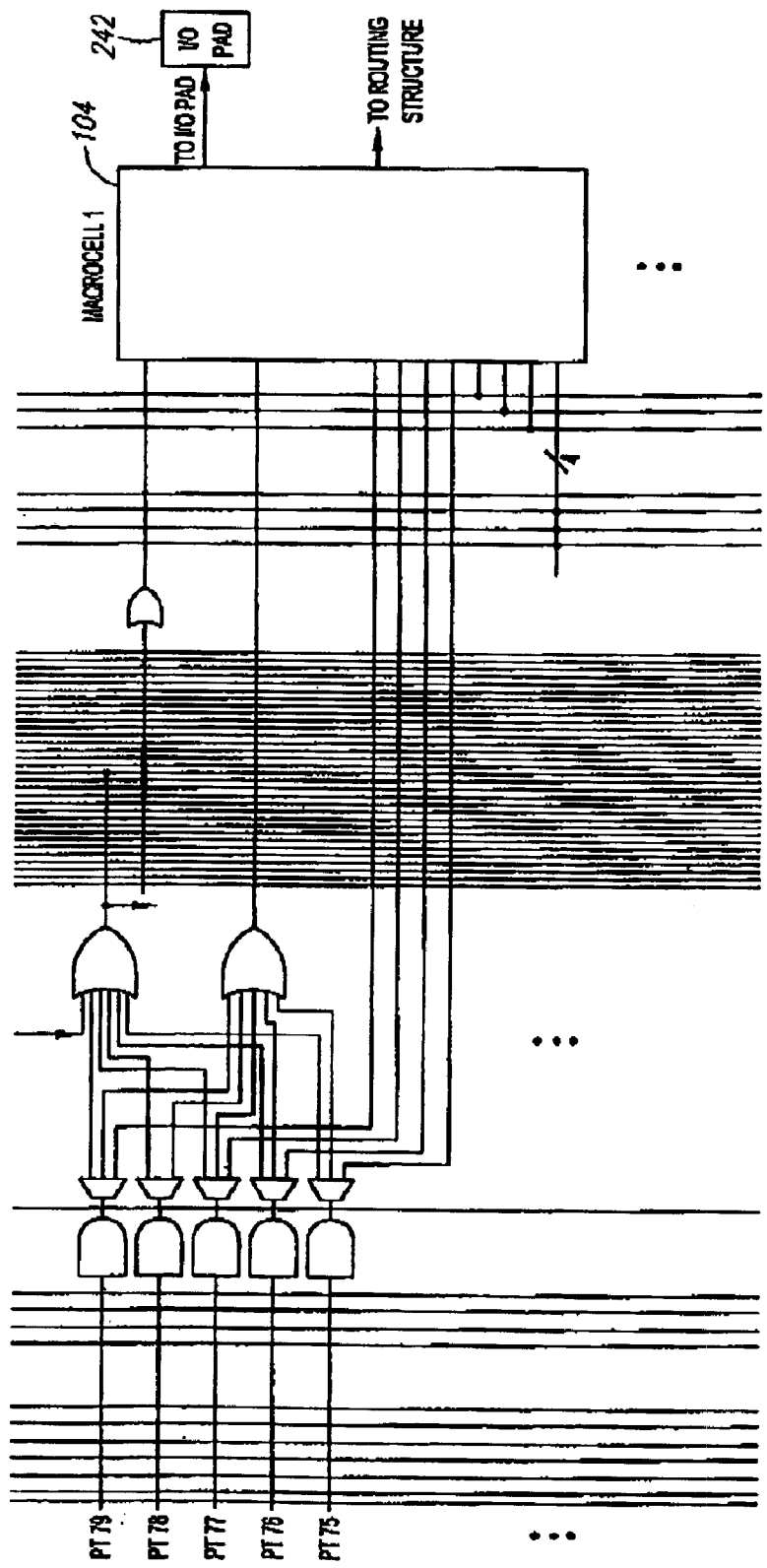
Figure 4:
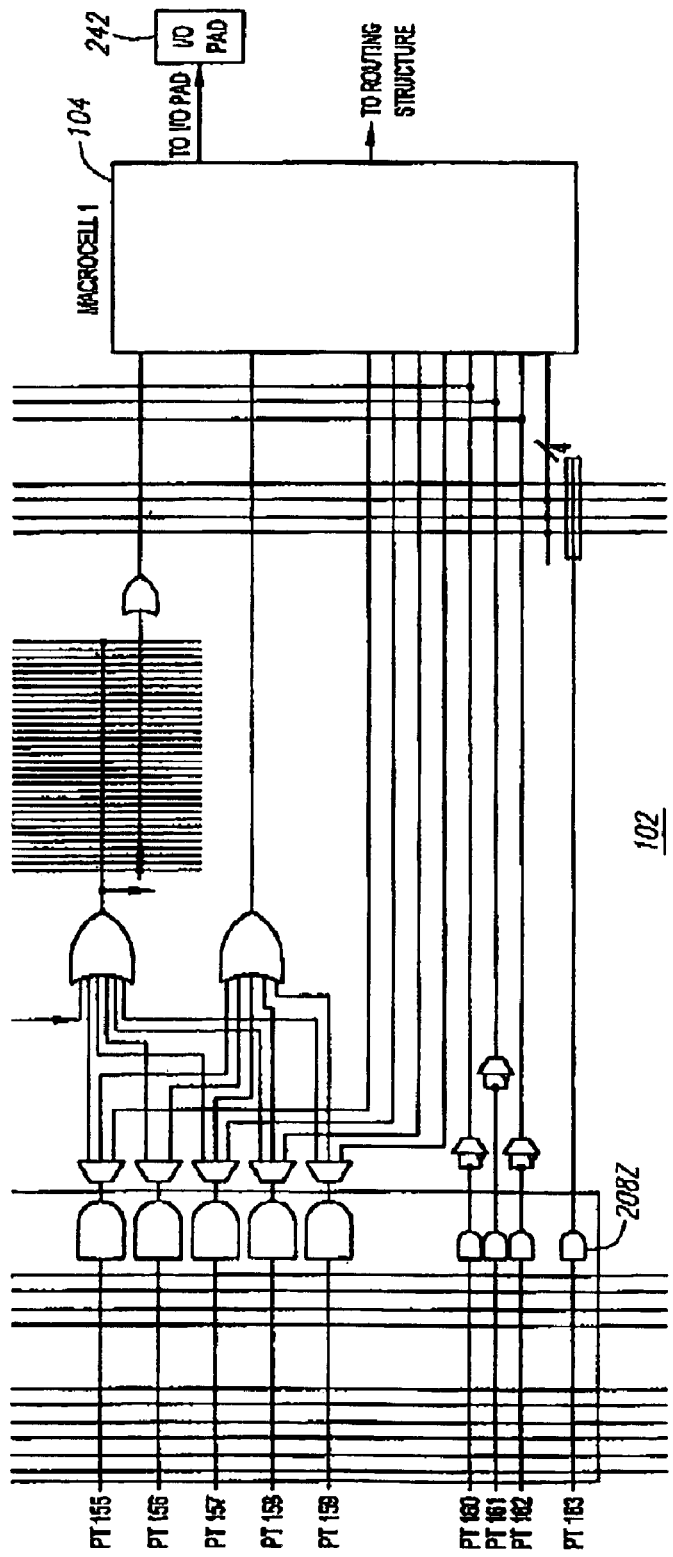

Logic blocks 302A–302H may be referred to as 'generic' or 'homogeneous' because the structure of each logic block 302 is similar, but each block 302 may be separately configured to perform one or more functions. FIG. 4 illustrates one embodiment of a programmable logic block 302 of FIG. 3. The programmable logic block 302 includes a programmable AND array 200 comprising a plurality of product term circuits such as illustrated circuits 208. Although each programmable logic block 302 may include any desired number of product term circuits 208, FIG. 4 illustrates an embodiment having 164 product term circuits 208. Each product term circuit may receive 68 logical inputs 290 coupled from routing structure 110 (FIG. 3). However, the actual number of logical inputs 290 coupled into each programmable logic block 302 is arbitrary and thus may be changed in alternative embodiments. Input ports 206 form the true and complement of each logical input 290. Thus, each product term circuit 208 may form the logical AND of up to 136 input variables. From these logical inputs, 164 product term outputs 1120 are provided by product term circuits 208, such that each product term output corresponds uniquely to its product term circuit 208. Each product term circuit 208 has fuse points 285 corresponding to each of the available 136 inputs such that if a fuse point 285 is activated, the corresponding input is selected. Accordingly, each product term circuit 208 includes 136 fuse points for each of its 136 input variables. A variety of SRAM or other type of volatile or non-volatile memory cells may be used to implement the fuse points 285. Should the fuse points be implemented with SRAM memory cells, they may be configured according to the contents of a non-volatile EEPROM configuration memory. The EEPROM cells storing the configuration signals may be "zero power" memory cells that consume substantially zero DC current during configuration and erasure as described in (1) U.S. Pat. No. 6,507,212, entitled 'Wide Input Programmable Logic System And Method,' filed on Nov. 2, 2000, and (2) U.S. Pat. No. 6,067,252, entitled 'Electrically Erasable Non-Volatile Memory Cell With Virtually No Power Dissipation,' filed on May 26, 1999. It will be appreciated, however, that other types of non-volatile memory cells such as conventional EEPROM cells may also be used with the present invention. Moreover, the use of volatile memory cells to store the configuration signals may also be used with the present invention.

Once all the applicable logical variables have been fused in for a given product term circuit 208, the corresponding product term output 1120 may be formed using a sense amplifier as is known in the art. Alternatively, a tiered logic structure such as described in U.S. Pat. No. 6,507,212 may be used to form the product term output. Each product term circuit 208 thus includes the fuse points 285 and the structure necessary to form the AND of whatever inputs are fused in. For example, a product term circuit 208 may include 136 SRAM cells (within fuse points 285) to provide 136 inputs, whose logical AND product 1120 is produced by the tiered logic structure discussed in U.S. Pat. No. 6,507,212. It will also be appreciated that other types of structures may be used to form the AND of the fused-in logical inputs such as a sense amplifier.

A plurality of macrocells 104 may register various sums of product term outputs 1120 from the product term circuits 208. For example, each macrocell 104 may receive the output of an OR gate 214. In turn, each OR gate 214 may form the sum of up to 5 product term outputs 1120 depending upon its configuration. Accordingly, each macrocell 104 corresponds to 5 product term circuits 208. In an embodiment having 32 macrocells 104, there would thus be 160 corresponding product term circuits 208. An additional plurality such as 4 product term circuits 208 may be used to form control signals for the macrocells 104. From macrocell 104, a logical output may be directed to pins 242. To permit the option of processing deeper (summing more product terms) logic functions, each macrocell 104 may also receive a product term sharing output from a corresponding OR gate 212. In turn, the output from OR gate 212 may be fused into an output from a product term sharing array 202 that is also driven by the outputs of 6 other input OR gates 212. Each OR gate 212 may receive the 5 product term outputs discussed with respect to OR gate 214. In addition, OR gates 212 may receive an output from other macrocells 104. In this fashion, each macrocell 104 may register various sum of product term outputs depending upon the logical functions a user wishes to implement. Multiplexers 210 selectively direct the product term outputs 1120 to OR gates 212 and 214 accordingly.

Cascading Product Terms

The device 300 in FIG. 3 can accommodate very wide input functions. Each programmable logic blocks 302A–302H can implement logical functions up to 68 inputs wide. By cascading two adjacent programmable logic blocks, such as 302A and 302B, the input width of each product term can be doubled such that the two programmable logic blocks can implement functions up to 136 (68+68) inputs wide. FIG. 3 shows at least four programmable logic blocks, such as the programmable logic blocks 302A–302D cascaded to form a cascade chain. The number of programmable logic blocks that can be cascaded depends on the layout of programmable logic blocks 302 in device 300 and whether device 300 has single level routing or double-level routing. Double-level routing (two level routing) allows more programmable logic blocks to be cascaded in groups.

Figure 5:
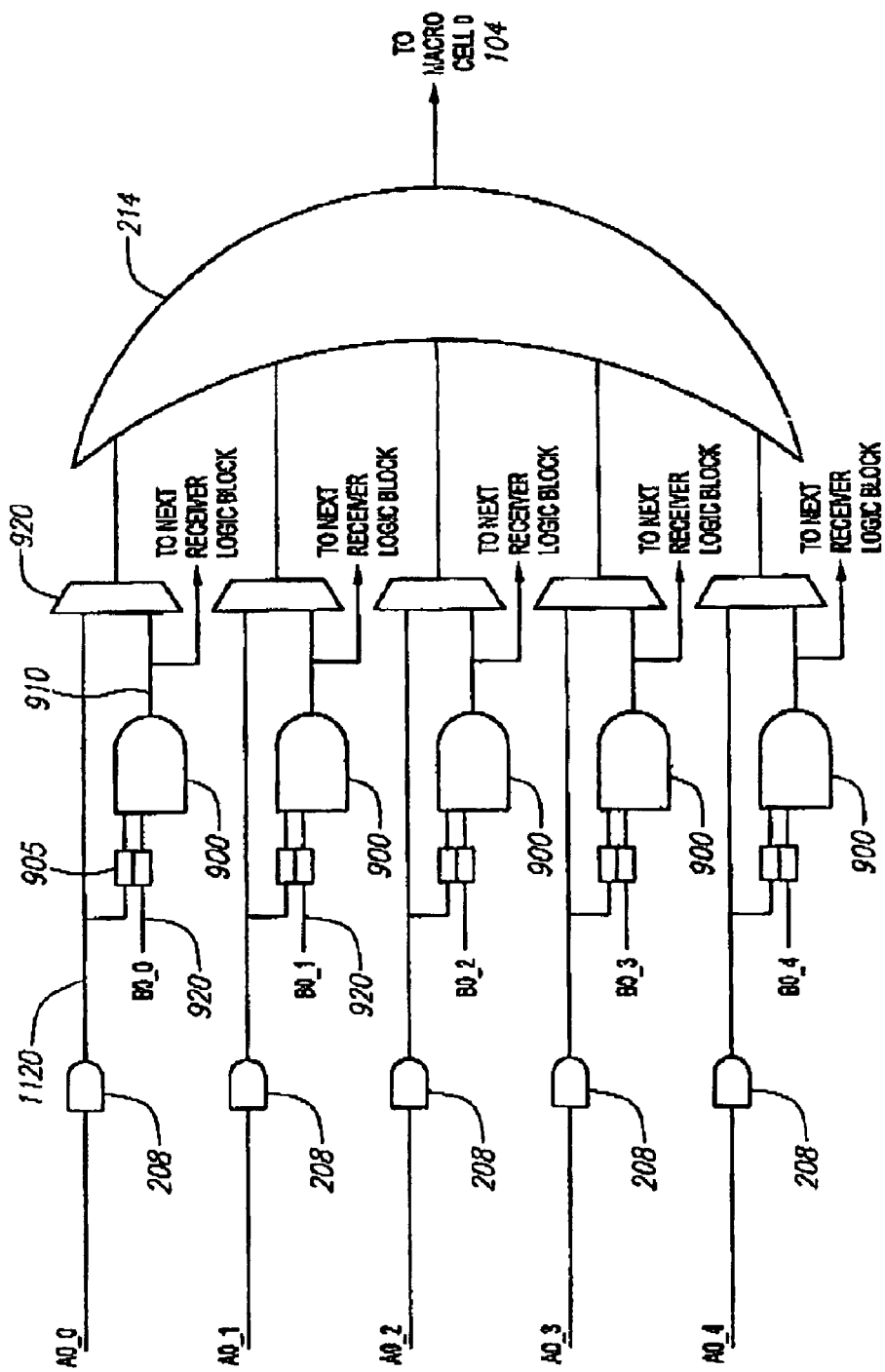
FIG. 5 illustrates product term cascading circuitry for the programmable logic block of FIG. 4 according to one embodiment of the invention.

With respect to cascading between two programmable logic blocks, one block acts as a feeder logic block in that it supplies product terms for cascading and the other acts as a receiver logic block in that it ANDs the cascaded product terms with its own product terms to produce wider-input logical outputs. For example, programmable logic block 302A may act as a feeder logic block and programmable logic block 302B may act as the corresponding receiver logic block. As described with respect to FIG. 4, each macrocell 104 has its own set of product term outputs 1120 that may be summed at OR gate 214. Each programmable logic block 302 has 32 macrocells 104 arranged from a macrocell 0 to a macrocell 31. The input-width product term cascading is arranged on a macrocell level such that, for example, the five product terms for macrocell 0 in a feeder logic block are cascaded with the corresponding five product terms for macrocell 0 in the receiver logic block. In a receiver logic block, these five product term outputs 1120 may be designated $A0\_0$ through $A0\_4$ whereas in the feeder logic block, the corresponding product term outputs may be designated as $B0\_0$ through $B0\_4$. As seen in FIG. 5, each feeder logic block contains AND gates 900 for forming the product of the cascaded product terms with its own corresponding product terms. For illustration clarity, AND gates 900 are illustrated only for macrocell 0. The cascading for the remaining macrocells occurs analogously. As seen in FIG. 5, product term outputs 1 20 $B0\_0$ through $B0\_4$ corresponding to macrocell 0 in a feeder logic block (such as programmable logic block 302A in FIG. 3) travel on dedicated leads 920 to the corresponding receiver logic block (such as programmable logic block 302B in FIG. 3). Because dedicated leads 920 extend directly from a feeder logic block to the corresponding receiver logic block without passing through routing structure 110, this direct product term cascading is most efficiently performed between physically adjacent programmable logic blocks such as programmable logic blocks 302A and 302B. Note the advantages of such an arrangement. In the present invention, product terms are cascaded efficiently from a feeder logic block to a receiver logic block without incurring any routing structure delays or burdens.

Within each receiver logic block, OR gates 214 receive the outputs of multiplexers 920. Each multiplexer 920 may be configured to select for a non-cascaded input. With respect to macrocell 0, multiplexers 920 would thus select for product term outputs 1120 $A0\_0$ through $A0\_4$. However, to achieve wider input logic functions, multiplexers 920 may be configured to select for outputs 910 of AND gates 900. AND gates 900 correspond to the product terms 1120 on a one-to-one basis. For example, with respect to macrocell 0, there is one AND gate 900 for each of product term outputs $A0\_0$ through $A0\_4$. When fuse points 905 are activated each AND gate 900 receives its product term (one of product terms $A0\_0$ through $A0\_4$) and the corresponding one from the feeder logic block (one of product terms $B0\_0$ through $B0\_4$). For ease of design and programmability, fuse points 905 for one macrocell may be all under the control of just one configuration memory cell. Thus, in such an embodiment, the product term cascading occurs solely at a macrocell level—the product terms for a single macrocell may not be selectively cascaded with respect to each other. However, in alternate embodiments, each fuse point 905 may be under the control of its own configuration memory cell. In this case, for example, just product terms $A0\_0$ and $B0\_0$ may be cascaded. Referring back to FIG. 3, a receiver logic block such as programmable logic block 302B may act as a feeder logic block for another receiver logic block such as 302C within a cascade chain. For a receiver logic block acting also as a feeder logic block, outputs 910 from AND gates 900 travel on dedicated paths analogously to paths 920 to AND gates 900 within the next receiver logic block in the cascade chain. Within a cascade chain, only the very first logic block and last logic block (such as programmable logic blocks 302H and 302E) do not have a dual role as both a feeder and a receiver logic block. In a feeder logic block, macrocell 104 may be configured to not register its own product terms if these product terms are being cascaded. In such a case, macrocell 104 can be used (1) logic functions and borrow product terms from other macrocells through the PTSA 204 (FIG. 4) or (2) as an input register coupled to an I/O pad 242 (FIG. 3).

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

What is claimed is:

1. A programmable logic device, comprising:
   a routing structure configured to provide logical inputs;
   a plurality of logic blocks, each logic block including a programmable AND array operable to provide a plurality of product terms from a plurality of the logical inputs provided by the routing structure, the plurality of product terms being arranged the same for each logic block; wherein a first one of the logic blocks forms a receiver logic block and a second one of the logic blocks forms a feeder logic block, the receiver logic block having an AND gate for each product term, each AND gate being operable to receive its product term and the corresponding product term in the feeder logic block, each corresponding product term being cascaded from the feeder logic block over a dedicated lead, and wherein each AND gate is operable to receive its product term and the corresponding product term in the feeder logic block through the operation of programmable fuses.

2. The programmable logic device of claim 1, wherein each logic block further comprises a plurality of macrocells, each macrocell coupling to a cluster OR gate operable to sum a cluster of the cascaded product terms from the AND gates such that each macrocell may register the sum of cascaded product terms from its cluster OR gate.

3. The programmable logic device of claim 1, wherein the receiver logic block further comprises a plurality of macrocells, each macrocell coupling to an N-input cluster OR gate operable to sum a plurality of N of the cascaded product terms from the AND gates such that each macrocell may register the sum of cascaded product terms from its N-input cluster OR gate, the, macrocells being arranged from a first macrocell to a last macrocell such that the first macrocell's N-input cluster OR gate may sum the first through the Nth cascaded product term, and so on.

4. The programmable logic device of claim 1, wherein the receiver logic block further comprises:

a plurality of multiplexers corresponding on a one-to-one basis with the plurality of AND gates, wherein each multiplexer is operable to select between its AND gate's product term input and the cascaded product term output to provide a selected signal, and wherein each logic block includes a plurality of macrocells, each macrocell coupling to a cluster OR gate operable to sum a cluster of the selected signals such that each macrocell may register a sum of cascaded product terms or a sum of product terms, whereby the inter-logic-block width cascading provided by the plurality of AND gates may be bypassed.

5. The programmable logic device of claim 4, wherein each AND gate is operable to receive its product term and the corresponding product term in the feeder logic block through the operation of programmable fuses.

6. The programmable logic device of claim 5, wherein, for each AND gate, the programmable fuses are arranged in a group and can be activated only as a group.

7. A programmable logic device, comprising:

a routing structure configured to provide logical inputs;

a plurality of logic blocks arranged from a first logic block to a last logic block, wherein each logic block includes a programmable AND array operable to provide a plurality of product terms from a plurality of the logical inputs provided by the routing structure, the plurality of product terms being arranged the same for each logic block, the first logic block being configured to cascade its products terms to the second logic block, the second logic block being configured to form the product of its product terms with the cascaded product terms from the first logic block and cascade the products to the third logic block, and so on such that the last logic block is configured to form the product of its product terms with the cascaded products from the next-to-the last logic block, and wherein the cascaded product terms and products propagate on dedicated paths separate from the routing structure, and wherein each logic block further comprises a plurality of macrocells, each macrocell coupling to a cluster OR gate operable to sum a cluster of the cascaded product terms such that each macrocell may register the sum of cascaded product terms from its cluster OR gate.

8. The programmable logic device of claim 7, wherein each logic block is configured to form products of its product terms using logic circuitry.

9. The programmable logic device of claim 8, wherein the logic circuitry comprises an AND gate for each product term.

10. The programmable logic device of claim 7, wherein the last logic block is a fourth logic block.

11. A programmable logic device, comprising:

a plurality of logic blocks each operable to provide a plurality of product terms selected from a plurality of logical inputs provided by a routing structure, wherein the plurality of product terms is arranged the same for each logic block and wherein the size of the plurality of logical inputs is the same for each logic block; and means for cascading product terms, wherein the means is configured to form the product of the product terms from a first one of the logic blocks with the corresponding product terms selected from one or more of the remaining logic blocks, and wherein for each logic block selected, the maximum-achievable input width for the product is increased by the plurality of logical inputs, and wherein each logic block further comprises a plurality of macrocells, each macrocell coupling to a cluster OR gate operable to sum a cluster of cascaded product terms such that each macrocell may register the sum of cascaded product terms from its cluster OR gate.

12. The programmable logic device of claim 11, wherein the plurality of logical inputs is 68 inputs.

13. The programmable logic device of claim 11, wherein the plurality of logic blocks comprises four logic blocks.

* * * * *